United States Patent
Kramer et al.

(10) Patent No.: US 8,804,414 B2
(45) Date of Patent: *Aug. 12, 2014

(54) SPIN TORQUE TRANSFER MEMORY CELL STRUCTURES AND METHODS

(71) Applicant: Micron Technology, Inc., Boise, ID (US)

(72) Inventors: Steven J. Kramer, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/926,780

(22) Filed: Jun. 25, 2013

(65) Prior Publication Data

US 2013/0286722 A1    Oct. 31, 2013

Related U.S. Application Data

(63) Continuation of application No. 13/652,957, filed on Oct. 16, 2012, now Pat. No. 8,472,244, which is a continuation of application No. 12/885,100, filed on Sep. 17, 2010, now Pat. No. 8,300,454.

(51) Int. Cl.
*G11C 11/15* (2006.01)

(52) U.S. Cl.
USPC ........... 365/171; 365/173; 365/158; 365/145; 257/95

(58) Field of Classification Search
USPC .................. 365/171, 173, 158, 145
See application file for complete search history.

(56) References Cited

U.S. PATENT DOCUMENTS

| | | | |
|---|---|---|---|
| 6,156,611 A | 12/2000 | Lan et al. | |
| 7,006,375 B2 | 2/2006 | Covington | |
| 7,598,579 B2 | 10/2009 | Horng et al. | |
| 7,709,885 B2 | 5/2010 | Daley et al. | |
| 7,742,328 B2 | 6/2010 | Chen et al. | |
| 8,283,712 B2 | 10/2012 | Kushida | |
| 8,300,454 B2 * | 10/2012 | Kramer et al. | 365/171 |
| 8,472,244 B2 * | 6/2013 | Kramer et al. | 365/171 |

(Continued)

FOREIGN PATENT DOCUMENTS

| EP | 2328194 A1 | 6/2011 |
|---|---|---|
| JP | 2001156357 A | 6/2001 |

(Continued)

OTHER PUBLICATIONS

International Search Report and Written Opinion for related PCT Applilcation No. PCT/US2011/001573, Mailed Mar. 28, 2012 (11 pages).

(Continued)

*Primary Examiner* — Hoai V Ho
*Assistant Examiner* — Jay Radke
(74) *Attorney, Agent, or Firm* — Brooks, Cameron & Huebsch, PLLC

(57) ABSTRACT

Spin Torque Transfer (STT) memory cell structures and methods are described herein. One or more STT memory cell structures include a tunneling barrier material positioned between a ferromagnetic storage material and a pinned ferromagnetic material in contact with an antiferromagnetic material. The tunneling barrier material is a multiferroic material and the antiferromagnetic material, the ferromagnetic storage material, and the pinned ferromagnetic material are positioned between a first electrode and a second electrode.

22 Claims, 8 Drawing Sheets

(56) References Cited

U.S. PATENT DOCUMENTS

| | | | |
|---|---|---|---|
| 2005/0045913 | A1 | 3/2005 | Nguyen et al. |
| 2005/0047198 | A1 | 3/2005 | Engel et al. |
| 2005/0199927 | A1 | 9/2005 | Lu |
| 2007/0285974 | A1 | 12/2007 | Takemura et al. |
| 2007/0296406 | A1 | 12/2007 | Shin et al. |
| 2008/0253174 | A1 | 10/2008 | Yoshikawa et al. |
| 2008/0310213 | A1 | 12/2008 | Chen et al. |
| 2009/0027810 | A1 | 1/2009 | Horng et al. |
| 2009/0096042 | A1 | 4/2009 | Rizzo et al. |
| 2009/0121266 | A1 | 5/2009 | Pietambaram et al. |
| 2009/0196818 | A1 | 8/2009 | Tokura et al. |
| 2009/0256220 | A1 | 10/2009 | Horng et al. |
| 2009/0279353 | A1 | 11/2009 | Worledge |
| 2009/0303779 | A1 | 12/2009 | Chen et al. |
| 2010/0065935 | A1 | 3/2010 | Horng et al. |
| 2010/0080048 | A1 | 4/2010 | Liu et al. |
| 2010/0103730 | A1 | 4/2010 | Shin |
| 2010/0110783 | A1 | 5/2010 | Liu et al. |
| 2010/0193888 | A1 | 8/2010 | Gu et al. |
| 2010/0220516 | A1 | 9/2010 | Lee et al. |
| 2011/0134689 | A1 | 6/2011 | Hayakawa |

FOREIGN PATENT DOCUMENTS

| | | |
|---|---|---|
| JP | 2004179219 A | 6/2004 |
| JP | 2008198792 A | 8/2008 |
| JP | 2010-098259 A | 4/2010 |
| JP | 2010114143 A | 5/2010 |
| WO | 2007099277 A1 | 9/2007 |
| WO | 2009010595 A1 | 1/2009 |
| WO | 20101032574 A1 | 3/2010 |
| WO | 2010-039424 A1 | 4/2010 |
| WO | 2010100678 A1 | 9/2010 |

OTHER PUBLICATIONS

International Search Report and Written Opinion for related PCT Applilcation No. PCT/US2011/001584, Mailed Apr. 20, 2012, (9 pages).

International Search Report and Written Opinion for related PCT Applilcation No. PCT/US2011/001585, Mailed Apr. 20, 2012, (10 pages).

Zavaliche, et al., "Electrically Assisted Magnetic Recording in Multiferroic Nanostructures," May 11, 2007, 5 pages, vol. 7, No. 6.

Driskill-Smith, et al., "STT-RAM—A New Spin on Universal Memory," Jul. 9, 2007, pp. 28-32, Future Fab Intl., vol. 23.

T. Zhao, et al. "Electrical control of antiferromagnetic domain in multiferroic BiFeO3 films at room temperature", Nature Materials, vol. 5, Oct. 2006, www.nature.com/naturematerials (7 pgs.).

F. Zavaliche, et al. "Multiferroic BiFeO3 films: domain structure and polarization dynamics", Phase Transitions. vol. 79, No. 12, Dec. 2006, 991-1017, http://www.tandf.co.uk/journals (27 pgs.).

Manuel Bibes, et al. "Multiferroics Towards a magnetoelectric memory. The room-temperature manipulation of magnetization by an electric field using the multiferroic BiFeO3 represents an essential step towards the magnetoelectric control of spintronics devices", Nature Materials, vol. 7, Jun. 2008, www.nature.com/naturematerials (2 pgs.).

Ying-Hao Chu, et al. "Electric-field control of local ferromagnetism using a magnetoelectric multiferroic", Nature Materials, vol. 7, Jun. 2008, www.nature.com/naturematerials (5 pgs.).

V.Garcia, et al. "Ferroelectric Control of Spin Polarization", Science, Feb. 26, 2010, vol. 327, No. 5969, pp. 1106-1110 (8 pgs.).

Bea, et al, "Spintronics with Multiferroics," Journal of Physics, Oct. 9, 2008, 11 pages.

Bea, et al, "Combining Half-Metals and Multiferroics into Expitaxial Heterostructures for Spintronics," Applied Physics Letters, Feb. 6, 2006, 4 pages.

Chu, et al., "Electric-field Control of Local Ferromagnetism Using a Magnetoelectric Multiferroic," Nature Materials, vol. 7, Apr. 27, 2008, pp. 478-482.

Office Action from related Taiwan patent application No. 100133502, dated Dec. 11, 2013, 17 pp.

Notice of Rejection Ground from related Japanese patent application No. 2013-529121, dated Apr. 30, 2014, 6 pp.

Office Action from related Taiwan patent application No. 100133502, dated May 21, 2014, 17 pp.

\* cited by examiner

SPIN TORQUE TRANSFER MEMORY CELL STRUCTURES AND METHODS

PRIORITY APPLICATION INFORMATION

This application is a Continuation of U.S. application Ser. No. 13/652,957, filed Oct. 16, 2012, to be issued as U.S. Pat. No. 8,472,244 on Jun. 25, 2013, which is a Continuation of U.S. application Ser. No. 12/885,100, filed Sep. 17, 2010, now U.S. Pat. No. 8,300,454, the specification of which is incorporated herein by reference.

TECHNICAL FIELD

The present disclosure relates generally to semiconductor memory devices, methods, and systems, and more particularly, to spin torque transfer (SIT) memory cell structures and methods.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, resistance variable memory, such as phase change random access memory (PCRAM) and resistive random access memory (RRAM), and magnetic random access memory (MRAM), such as spin torque transfer random access memory (STT RAM), among others.

MRAM devices can employ a magnetic tunneling junction (MTJ) that can be viewed as a multi-state resistor due to different relative orientations (e.g., parallel and antiparallel) of the magnetic moments, which can change the magnitude of a current passing through the device. In a write process, magnetic fields caused by currents passing through conductive lines (e.g., word and bit lines) can be used to switch a magnetic moment direction of a "free" material of the MTJ, which can place the device in a high or low resistance state. A read process can then be used to determine the state of cell.

As the size of MRAM cells decreases, the distance between adjacent cells also decreases, which can result in increased cell disturb caused by the current carrying lines used to switch the magnetic moment directions. As an example, the write current associated with a MRAM device can be about 10 mA. can be difficult as the size of the MRAM cells and current carrying lines decreases. For instance, the smaller width lines can require greater currents to produce the necessary switching fields, which increases power consumption.

STT devices share some of the operational features of previous MTJ cells; however, switching of the free material magnetic moment (e.g., the write process) can be produced by passage of the spin polarized current itself. For instance, unpolarized conduction electrons passing through a first magnetic material having its magnetic moment oriented in a given direction (e.g. a "pinned" material) are preferentially polarized by their passage through that material by a quantum mechanical exchange interaction with the polarized bound electrons in the material. Such a polarization can occur to conduction electrons that reflect from the surface of the magnetized material as well as to those that pass through it. The efficiency of such a polarization process can depend upon the crystalline structure of the material. When such a stream of polarized conduction electrons subsequently pass through a second magnetic material (e.g., the "free" material) whose polarization direction is not fixed in space, the polarized conduction electrons exert a torque on the bound electrons in the magnetic materials which, if sufficient, can reverse the polarization of the bound electrons and, thereby, reverse the magnetic moment of the magnetic material.

The use of a current internal to the cell to cause the magnetic moment reversal provides for smaller currents (e.g., about 200 microamps) than those required to produce an external magnetic field (e.g., from adjacent current carrying lines) to produce the moment switching. However, further reduction in the current used to produce magnetic moment switching in STT RAM cells can provide benefits such as further reducing the energy consumption and thermal profile in the materials associated with such cells, which can improve cell integrity and reliability, among other benefits.

DETAILED DESCRIPTION

Figure 1A:
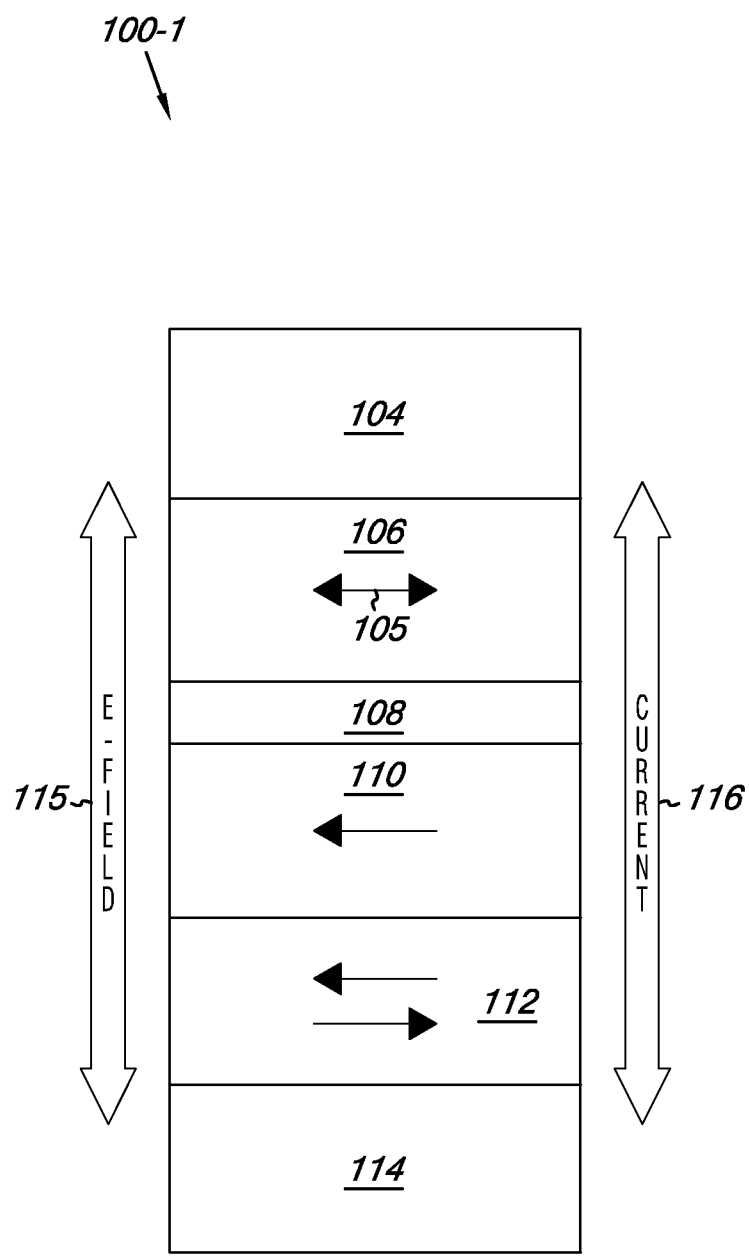
FIG. 1A illustrates an STT memory cell structure in accordance with one or more embodiments of the present disclosure.

Spin Torque Transfer (STT) memory cell structures and methods are described herein. One or more STT memory cell structures include a tunneling barrier material positioned between a ferromagnetic storage material and a pinned ferromagnetic material in contact with an antiferromagnetic material. The tunneling barrier material is a multiferroic material and the antiferromagnetic material, the ferromagnetic storage material, and the pinned ferromagnetic material are positioned between a first electrode and a second electrode.

Embodiments of the present disclosure provide various benefits such as providing magnetic switching within STT memory cells via an applied electric field (e.g., due to exchange coupling between a multiferroic tunneling barrier material in contact with a ferromagnetic storage material associated with the cell). Embodiments can provide for a reduced programming current as compared to previous STT memory cells. Embodiments can also provide benefits such as added data reliability and/or stability upon switching (e.g., by preventing thermally induced magnetic switching), multi-bit STT memory cell capability, and a reduced physical footprint as compared to previous STT memory cells, among other benefits.

The figures herein follow a numbering convention in which the first digit or digits correspond to the drawing figure number and the remaining digits identify an element or component in the drawing. Similar elements or components between different figures may be identified by the use of similar digits.

For example, 104 may reference element "04" in FIG. 1, and a similar element may be referenced as 204 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIG. 1A illustrates an STT memory cell structure 100-1 in accordance with one or more embodiments of the present disclosure. The memory cell structure 100-1 comprises a stack structure that includes a tunneling barrier material 108 positioned between a ferromagnetic storage material 106 and a pinned ferromagnetic material 110 in contact with an antiferromagnetic material 112. The materials 106, 108, 110, and 112 form an magnetic tunneling junction (MTJ) element and are positioned between a first electrode 104 (e.g., a top electrode) and a second electrode 114 (e.g., a bottom electrode). In various embodiments of the present disclosure, the tunneling barrier material 108 of the MTJ element is a multiferroic material 108. The multiferroic material 108 can exhibit coupled ferroelectricity and ferromagnetism and/or antiferromagnetism. As examples, the multiferroic material 108 can be BiFeO3 (BFO), TbMn2O5, TbMnO3, $Bi_4Fe_2TiO_{12}$, or $NiBi_2O_4$, among other multiferroic materials.

The arrow illustrated in the pinned ferromagnetic material 110 indicates the direction of magnetization within the material 110. The arrow 105 indicates alternative directions of the magnetization within the ferromagnetic storage material 106 of structure 100-1 (e.g., the magnetization direction 105 is switchable between a parallel or antiparallel orientation as compared to the magnetization direction of material 110). As one of ordinary skill in the art will appreciate, a spin polarized current can be applied to the memory structure 100-1 (e.g., in a current perpendicular to plane configuration between the electrodes 104 and 114), which can switch the magnetization direction of the ferromagnetic storage material 106 when the critical switching current density (Jc) is exceeded. The different directions of magnetization 105 can correspond to particular data states of an STT RAM cell.

In one or more embodiments of the present disclosure, the magnetic polarization of a "free" magnetic material (e.g., magnetization direction 105 of ferromagnetic storage material 106) in an STT memory cell can be altered and/or controlled via application of electric fields, which can provide benefits such as reducing the programming current used to achieve magnetic polarization switching within the cell, among other benefits. One or more embodiments include a multiferroic material (e.g., a ferroelectric antiferromagnetic multiferroic material and/or a ferroelectric ferromagnetic multiferroic material) functioning as the tunneling junction material of an MTJ element associated with the STT memory cell.

Application of an electric field to the multiferroic tunneling barrier material (e.g., 108) can be used to manipulate (e.g., rotate) the antiferromagnetic ordering and/or ferromagnetic ordering within the multiferroic (e.g., by changing the ferroelectric ordering coupled to the ferromagnetic and/or antiferromagnetic ordering within the multiferroic material). As an example, a current 116 (e.g., a programming current) flowing through the structure 100-1 can produce an electric field 115 through the stack structure (e.g., an electric field produced between the top electrode 104 and the bottom electrode 114). The electric field 115 rotates the ferroelectric polarization within the multiferroic tunneling barrier material 108, which can reduce the current required to induce switching of the magnetization 105 (e.g., with respect to the magnetization direction of the pinned ferromagnetic material 110) from parallel to antiparallel, or vice versa, during a programming operation. The multiferroic tunneling material 108 can have a thickness of about 1 nanometer (nm) or less, in various embodiments. However, the thickness of material 108 is not so limited. For instance, the thickness of material 108 can be various thicknesses suitable for performing as a spin polarizing tunnel material.

As described further below, in various embodiments, a ferroelectric polarization change within the multiferroic tunneling barrier material 108 (e.g., as a result of an applied electric field), can change the antiferromagnetic and/or ferromagnetic ordering of the multiferroic material 108. As a result of exchange coupling between the multiferroic material 108 and the ferromagnetic storage material 106, the antiferromagnetic and/or ferromagnetic ordering of the multiferroic material influences the magnetic polarization 105 of the ferromagnetic storage material 106. As such, the inherent coupling of the ferroic order parameters (e.g., the ferroelectric order parameter coupling with either or both of the ferromagnetic and antiferromagnetic order parameter) within a multiferroic material (e.g., 108) can be used to manipulate (e.g., switch) the magnetic polarization (e.g., 105) of a ferromagnetic material (e.g., 106) coupled thereto.

In various embodiments, one or more electrodes in addition to the top electrode 104 and the bottom electrode 114 can be used to provide an electric field to the multiferroic material 108 in order to alter the magnetization direction 105 of ferromagnetic storage material 106. As described below, the additional electrodes can be external to the STT stack structure 100-1. In one or more embodiments, the additional electrodes can be gate electrodes of an access device (e.g., a vertical access device) coupled to the STT stack 100-1.

In some instances, the exchange coupling between the multiferroic tunneling barrier 108 and the ferromagnetic storage material 106 may be sufficient to switch the magnetization direction 105 of the storage material 106 (e.g., from parallel or antiparallel to the magnetization direction of the pinned material 110 to antiparallel or parallel). In instances in which the exchange coupling between the multiferroic material 108 and storage material 106 is insufficient to induce a full switching of the magnetization direction 105 of the storage material 106, a "magnetic torque" can be induced that can reduce the current required to induce full switching in the STT memory cell. Moreover, the induced magnetic torque can provide added data reliability and/or stability upon switching (e.g., by preventing thermally induced magnetic switching).

Figure 1B:
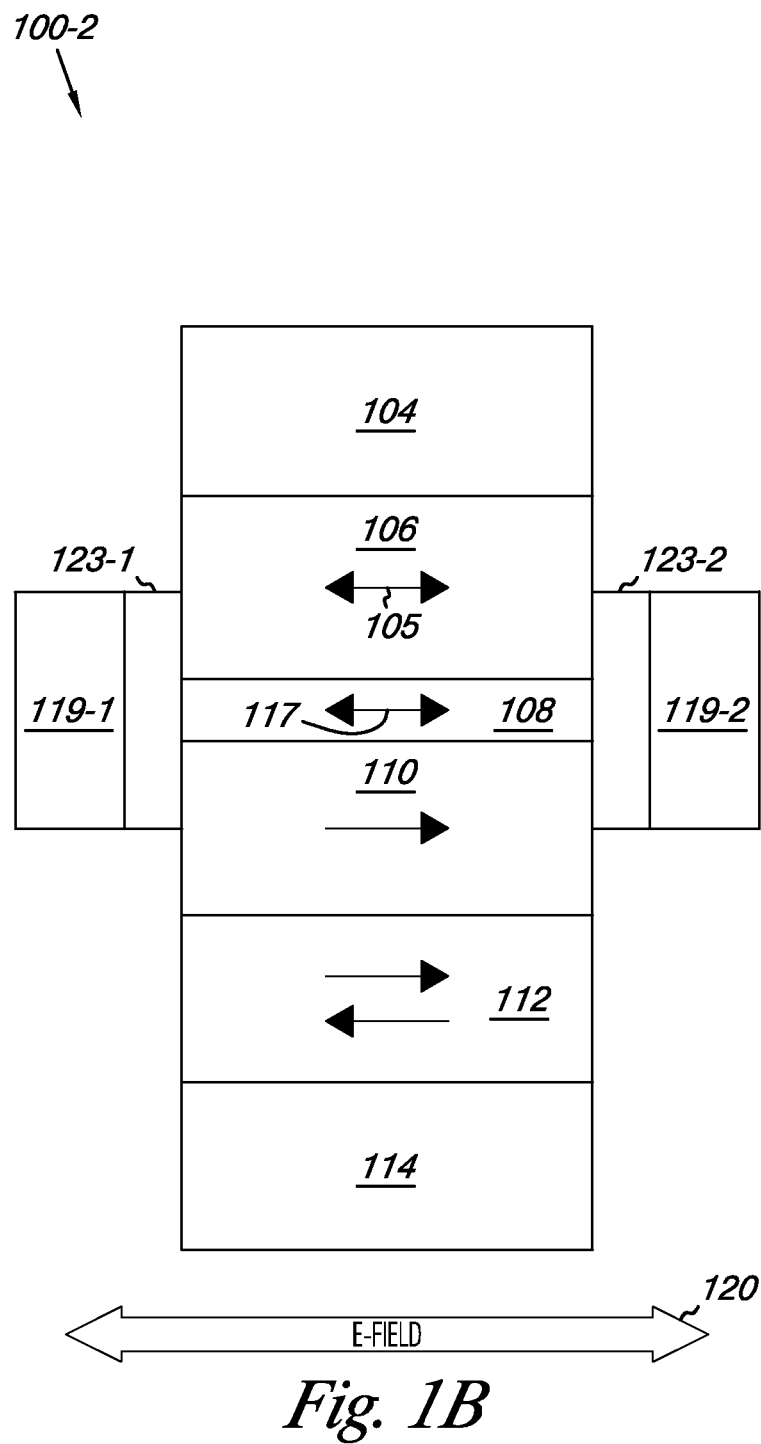
FIG. 1B illustrates an STT memory cell structure in accordance with one or more embodiments of the present disclosure.

As an example, the STT memory cell structure 100-2 illustrated in FIG. 1B includes electrodes 119-1 and 119-2, which are in addition to the top electrode 104 and the bottom electrode 114. The electrodes 119-1 and 119-2 are external to the STT stack structure 100-1 shown in FIG. 1A. In this example, the electrodes 119-1 and 119-2 are configured to provide an electric field 120 to the multiferroic tunneling barrier material 108 (e.g., due to an applied voltage difference between the electrodes 119-1 and 119-2). The electric field 120 affects the antiferromagnetic ordering of the multiferroic material 108, which can alter the switchable magnetization direction 105 of the ferromagnetic storage material 106, as described above. The arrow 117 represents the switchable ferroelectric polarization direction of the multiferroic tunneling barrier material 108.

The STT structure 100-2 includes a dielectric material 123-1 positioned between the electrode 119-1 and an outer edge portion of the multiferroic material 108 and a dielectric material 123-2 positioned between the electrode 119-2 and an opposing outer edge portion of the multiferroic material 108. The dielectric materials 123-1 and 123-2 can be an oxide material or other dielectric material and can prevent damage to the multiferroic tunneling barrier material 108.

In some embodiments, an electric field can be applied to the multiferroic material 108 responsive to an applied voltage between one of the electrodes 119-1/119-2 and one of the electrodes 104/114. In various embodiments, such an electric field can be sufficient to alter the magnetization direction 105 of the material 106 (e.g., due to exchange coupling between the multiferroic and the material 106 resulting from induced polarization changes in multiferroic 108).

Figure 1C:
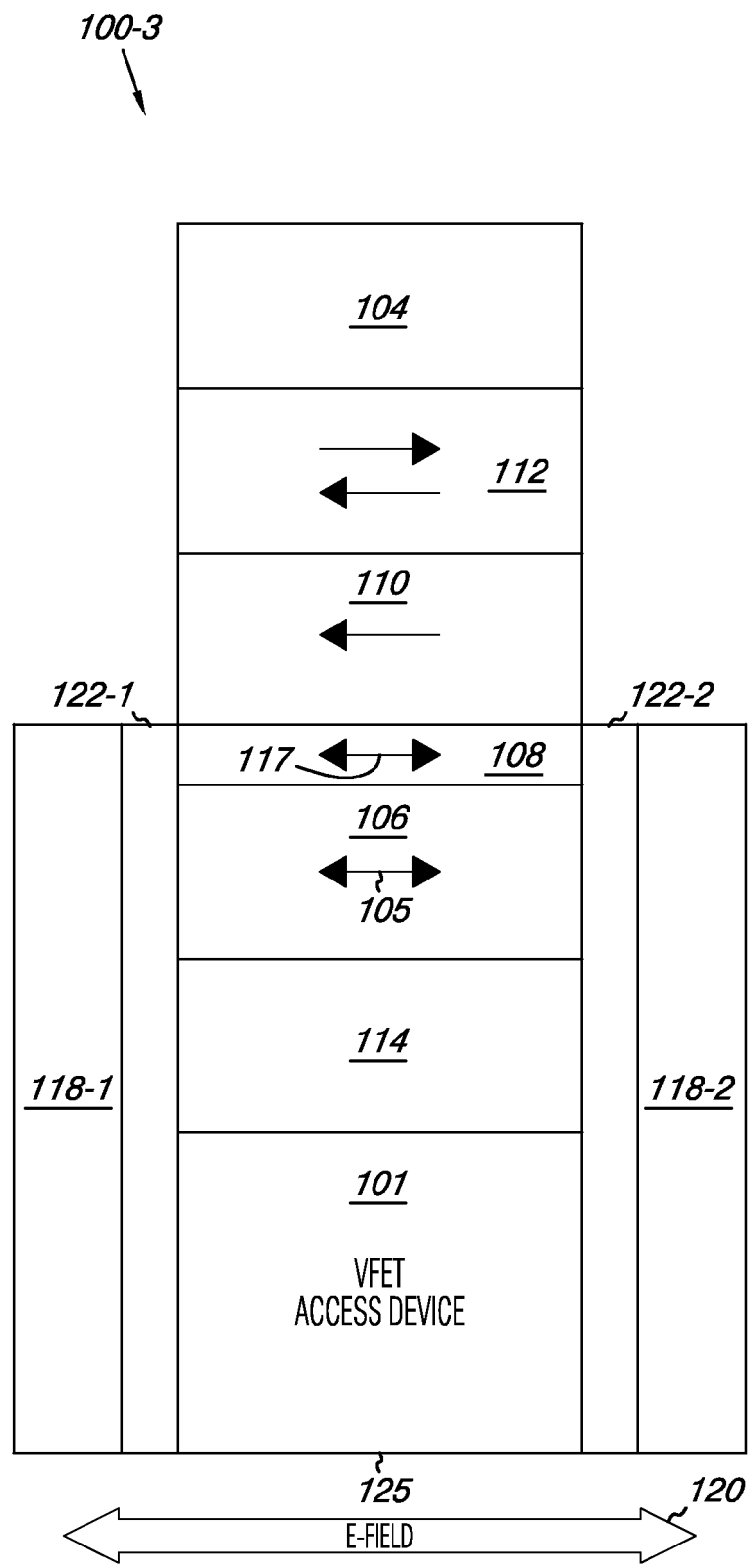
FIGS. 1C-1E illustrate an STT memory cell structure in accordance with one or more embodiments of the present disclosure.
Figure 1D:
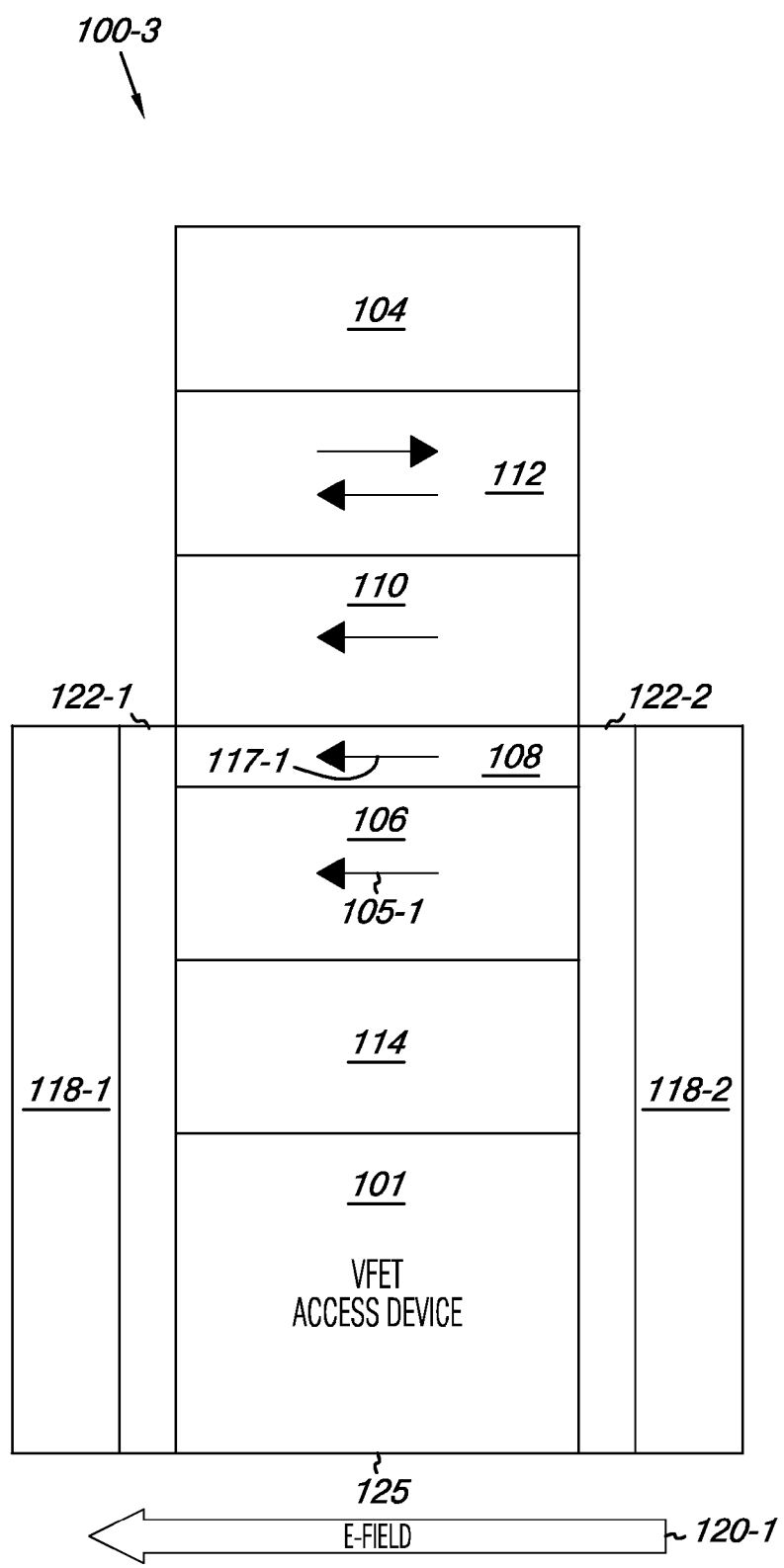
Figure 1E:
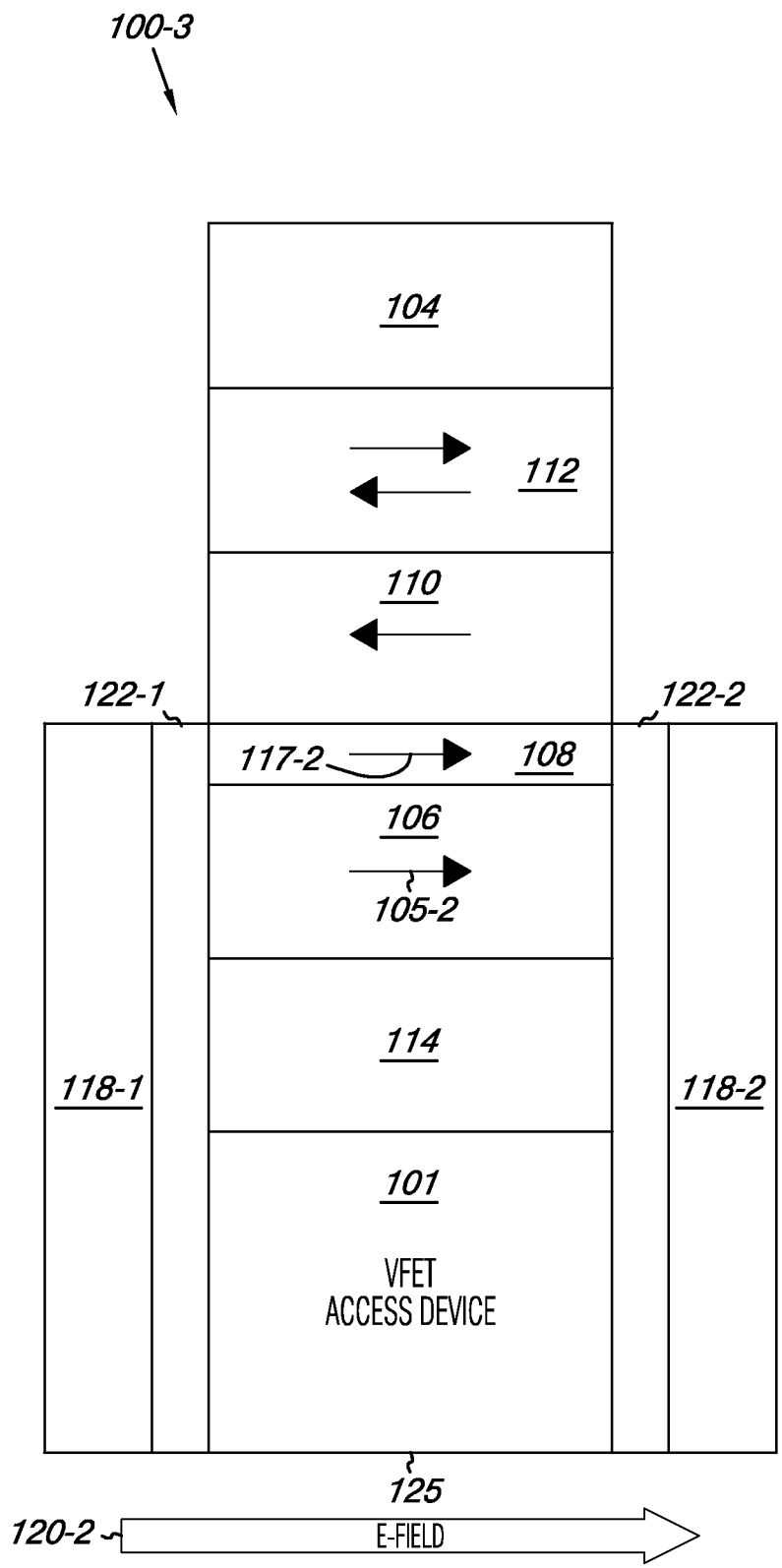

FIGS. 1C-1E illustrate an STT memory cell structure 100-3 in accordance with one or more embodiments of the present disclosure. The memory structure 100-3 includes the STT stack structure 100-1 shown in FIG. 1A coupled to an access device 125. In this example, the access device is a vertical field effect transistor (VFET) 125 formed from or on a substrate 101. The substrate can be a silicon substrate, silicon on insulator (SOI) substrate, or silicon on sapphire (SOS) substrate, among others.

As described in connection with FIGS. 1A and 1B, the STT structure 100-3 includes a MTJ element positioned between a top electrode 104 and a bottom electrode 114. The tunneling barrier material 108 of the MTJ is a multiferroic material. In this example, the multiferroic tunneling barrier material 108 is located between a first gate electrode 118-1 and a second gate electrode 118-2 of the vertical access device 125. The multiferroic tunneling barrier material 108 is in contact with the ferromagnetic storage material 106 and the pinned ferromagnetic material 110. A first edge portion of the multiferroic material 108 is aligned with a first edge portion of the ferromagnetic storage material 106 and a second edge portion of the multiferroic material 108 is aligned with a second edge portion of the ferromagnetic storage material 106.

The gate electrodes 118-1 and 118-2 are configured to provide an electric field 120 to the multiferroic material 108 in association with a programming operation performed on the STT memory cell. In this example, a gate oxide 122-1/122-2 corresponding to the VFET 125 insulates the multiferroic tunneling barrier material 108 from the respective gate electrodes 118-1/118-2. As described above, the magnetization direction 105 is switchable (e.g., between a parallel and antiparallel orientation with respect to the magnetization direction of the pinned material 110). The direction of the electric field 120 affects the ferroelectric polarization direction 117 of the multiferroic material 108, which can induce antiferromagnetic exchange coupling between the multiferroic 108 and the ferromagnetic material 106, which can thereby alter the magnetization direction 105 of material 106.

For instance, the embodiment of FIG. 1D illustrates an electric field 120-1 provided to the STT structure 100-3 via an applied voltage difference between the gate electrodes 118-1 and 118-2. The arrow 117-1 indicates the induced ferroelectric polarization direction within the multiferroic tunneling barrier material 108 due to the applied electric field 120-1, Arrow 105-1 indicates the magnetization direction corresponding to the ferromagnetic storage material 106 of the MTJ (e.g., parallel to the magnetization direction of the pinned ferromagnetic material 110, in this example). The induced ferroelectric polarization 117-1 within material 108 affects the antiferromagnetic ordering of the multiferroic material 108, which in turn affects the magnetization direction 105-1 of the ferromagnetic storage material 106. The arrows 117-1 and 105-1 are examples and may not represent the actual order parameter orientations within the respective materials.

The embodiment illustrated in FIG. 1E illustrates an electric field 120-2 provided to the STT structure 100-3 via an applied voltage difference between the gate electrodes 118-1 and 118-2. The arrow 117-2 indicates the induced ferroelectric polarization direction within the multiferroic tunneling barrier material 108 due to the applied electric field 120-2. Arrow 105-2 indicates the magnetization direction corresponding to the ferromagnetic storage material 106 of the MTJ (e.g., antiparallel to the magnetization direction of the pinned ferromagnetic material 110). In this example, the induced exchange coupling between the multiferroic 108 and the storage material 106 due to the electric field 120-2 is sufficient to switch the magnetization direction 105 of the storage material 106 (e.g., from the parallel orientation 105-1 shown in FIG. 1D to the antiparallel orientation 105-2 shown in FIG. 1E). The arrows 112-1 and 105-2 are examples and may not represent the actual order parameter orientations within the respective materials.

As noted above, in one or more embodiments, the electric field (e.g., 120-2) between the electrodes (e.g., 118-1 and 118-2) may not be sufficient to fully switch the magnetization 105 of the ferromagnetic storage material 106. However, in such cases, a remnant magnetic torque can be induced within the storage material 106, which can reduce the barrier to switching in the STT memory cell. For instance, the required programming current density to induce switching of the magnetization (e.g., from direction 105-1 to 105-2) is reduced due to the exchange coupling between the multiferroic tunneling barrier material 108 and the storage material 106 under the applied electric field 120-2.

In one or more embodiments, the gate electrodes gate electrodes 118-1/118-2 can form a "surround gate" structure. For instance, the electrodes 118-1/118-2 can wrap around the access device 125. In some such embodiments, the electrodes 118-1/118-2 can be a single gate electrode that can surround the access device 125 and/or the multiferroic material (e.g., 108).

Figure 2A:
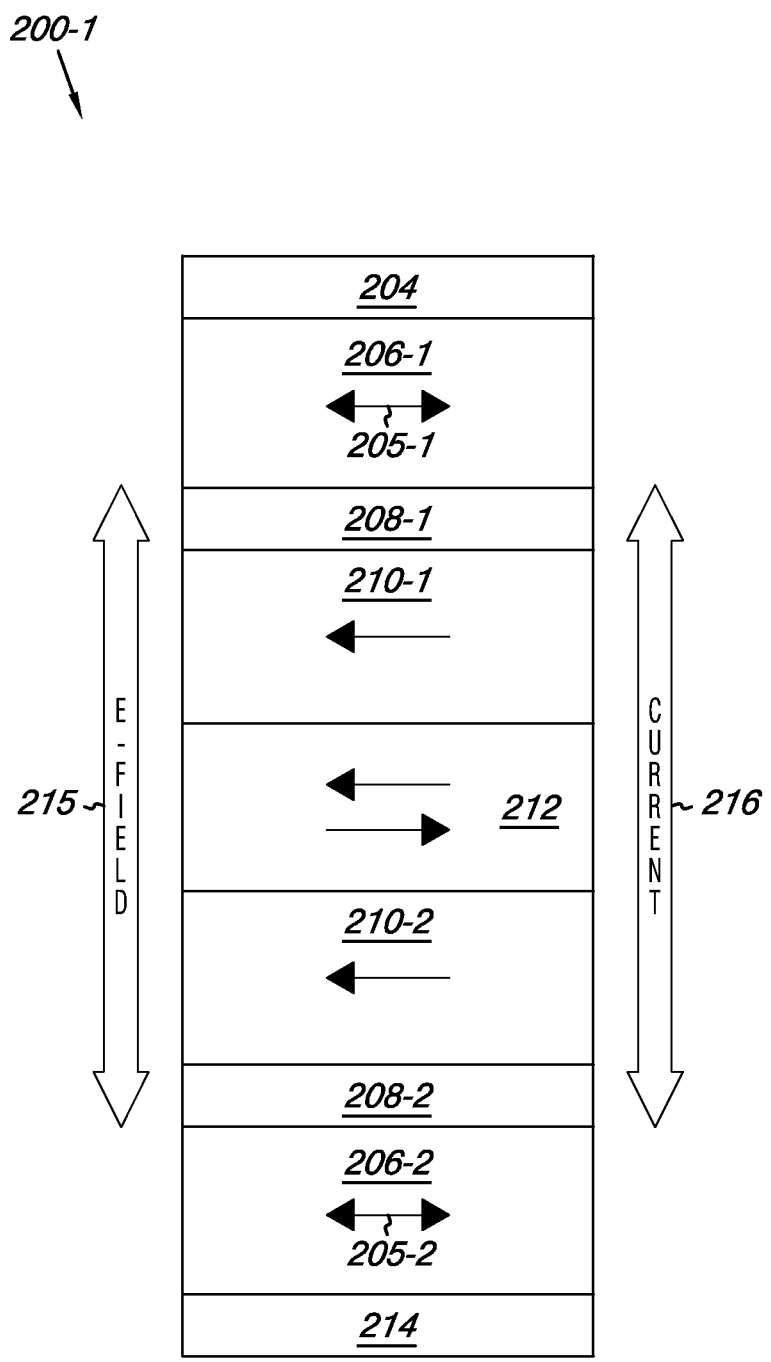
FIG. 2A illustrates an STT memory cell structure in accordance with one or more embodiments of the present disclosure.

FIG. 2A illustrates an STT memory cell structure 200-1 in accordance with one or more embodiments of the present disclosure. The memory cell structure 200-1 is a multi-bit structure comprising a stack structure that includes a first multiferroic tunneling barrier material 208-1 positioned between a first ferromagnetic storage material 206-1 and a first pinned ferromagnetic material 210-1. The structure 200-1 includes a second multiferroic tunneling barrier material 208-2 positioned between a second ferromagnetic storage material 206-2 and a second pinned ferromagnetic material 210-2. An antiferromagnetic material 212 is located between the pinned ferromagnetic materials 210-1 and 210-2. As such, the materials 206-1, 208-1, 210-1, and 212 form a first MTJ element positioned between a top electrode 204 and a bottom electrode 214. Similarly, the materials 206-2, 208-2, 210-2, and 212 form a second MTJ element positioned between the top electrode 204 and the bottom electrode 214. In this example, the first ferromagnetic storage material 506-1 is in contact with the top electrode 204 and the second ferromagnetic storage material 506-2 is in contact with the bottom electrode 214.

The arrow illustrated in the pinned ferromagnetic materials 210-1 and 210-2 indicate the direction of magnetization within the respective material 210-1 and 210-2. The arrows 205-1 and 205-2 indicate alternative directions of the magnetization within the respective ferromagnetic storage materials 206-1 and 206-2 of structure 200-1 (e.g., the magnetization directions 205-1 and 205-2 are switchable between a parallel or antiparallel orientation as compared to the magnetization direction of respective pinned materials 210-1 and 210-2).

The current 216 can represent a spin polarized current applied to the memory structure 200-1 (e.g., in a current perpendicular to plane configuration between the electrodes 204 and 214). The current 216 produces an electric field 215 that rotates the ferroelectric polarization of the multiferroic tunneling barrier materials 208-1 and 208-2, which can reduce the magnitude of the critical current density (Jc) required to induce switching of the magnetization directions 205-1 and 205-2 of the respective ferromagnetic storage materials 506-1 and 506-2.

As described above, exchange coupling between the multiferroic materials 208-1/208-2 and the ferromagnetic storage materials 206-1/206-2, responsive to an applied electric field, can influence the magnetic polarization 205-1/205-2 of the ferromagnetic storage materials 206-1/206-2. As an example, the STT structure 200-2 illustrated in FIG. 2B includes a stack structure such as structure 200-1 coupled to a vertical access device 225. The gate electrodes 218-1 and 218-2 of the VFET 225 are configured to provide an electric field (e.g., 220) to the multiferroic tunneling barrier materials 208-1 and 208-2 in order to alter the magnetization direction 205-1 of ferromagnetic storage material 206-1 and/or to alter the magnetization direction 205-2 of ferromagnetic storage material 206-2. A gate oxide material 222-1/222-3 insulates the first and second MTJ elements from the gate electrodes 218-1/218-2.

Figure 2B:
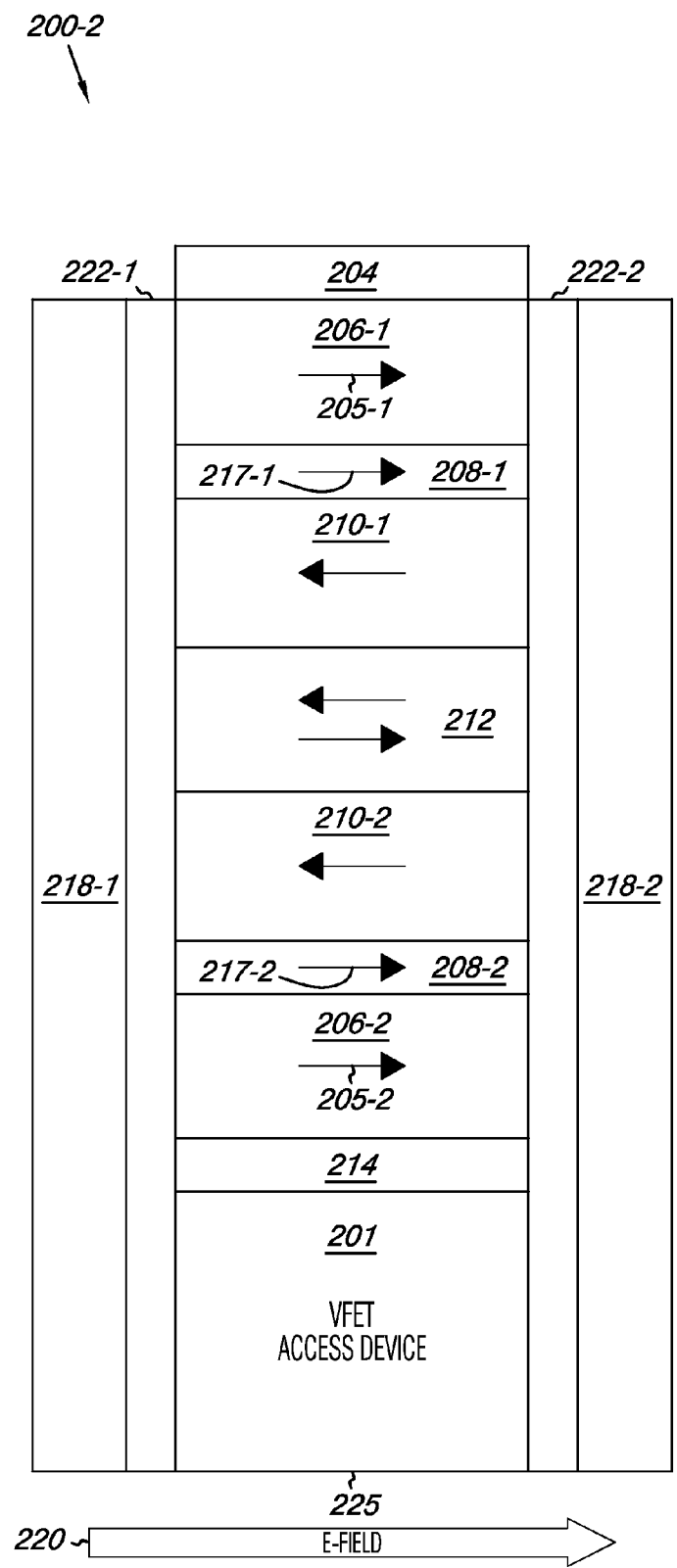
FIG. 2B illustrates an STT memory cell structure in accordance with one or more embodiments of the present disclosure.

In the example illustrated in FIG. 2B, the provided electric field 220 results in magnetization direction 205-1 and 205-2 having an antiparallel configuration with respect to the magnetization of the pinned ferromagnetic materials 210-1 and 210-2. Arrows 217-1 and 217-2 indicate the induced ferroelectric polarization direction of multiferroic materials 208-1 and 208-2, respectively, due to the applied electric field 220. As described above, the induced polarization 217-1 and 217-2 can contribute to (e.g., influence) the magnetization direction 205-1 and 205-2 due to exchange coupling between the multiferroic tunneling barrier materials 208-1/208-2 and respective ferromagnetic storage materials 206-2/206-2. The arrows 217-1, 217-2, 205-1, and 205-2 are examples and may not represent the actual order parameter orientations within the respective materials.

In various embodiments, the first multiferroic tunneling barrier material 208-1 can have a different ferroelectric polarizability than the second multiferroic tunneling barrier material 208-2. Differing ferroelectric polarizabilities between the multiferroic materials 208-1/208-2 can lead to different voltage requirements associated with the particular multiferroic material. As such, the applied voltage difference between gate electrodes 218-1 and 218-2 required to produce an electric field (e.g., 220) sufficient to rotate the antiferromagnetic and/or ferromagnetic order within the multiferroic material (e.g., 208-1 and 208-2) can vary depending on the type of multiferroic material. As an example, the first multiferroic tunneling barrier material 208-1 may be BiFeO3 (BFO) and the second multiferroic tunneling barrier material 208-2 may be TbMn2O5, or another multiferroic material having a ferroelectric polarizability different from that of the multiferroic material 208-1. In some such embodiments, a particular electric field (e.g., 220) provided to the stack structure 200-2 may be sufficient to switch the magnetization direction of one of the first and the second ferromagnetic storage material 206-1/206-2 while being insufficient to switch the magnetization direction of the other ferromagnetic storage material 5206-1/206-2. As such, the relative orientations of the magnetization directions 205-1 and 205-2 can be controlled via an applied electric field (e.g., 220).

The different relative orientations of magnetization directions 205-1 and 205-2 can correspond to different resistance values of the stack structure 200-2, which can in turn correspond to multiple different data states. For example, a read operation can be performed by providing a read current through the stack 200-2 (e.g., via a bit line and source line as described in FIG. 3) and determining a resistance level associated therewith (e.g., via a sensed voltage difference between the bit line and source line). As one example, the resistance level of the structure 200-2 when the magnetization 205-1 and 205-2 are both antiparallel to the magnetization of the pinned ferromagnetic materials 210-1 and 210-2 (e.g., as shown in FIG. 2B) can correspond to a first multi-bit data state (e.g., "11"). In this example, the resistance level of the structure 200-2 when the magnetization 205-1 is antiparallel to material 210-1 and the magnetization 205-2 is parallel to material 210-2 can correspond to a second multi-bit data state (e.g., "10"), the resistance level of the structure 200-2 when the magnetization 205-1 is parallel to material 210-1 and the magnetization 205-2 is antiparallel to material 210-2 can correspond to a third multi-bit data state (e.g., "01"), and the resistance level of the structure 200-2 when the magnetizations 205-1 and 205-2 are both parallel to materials 210-1 and 210-2 can correspond to a fourth multi-bit data state (e.g., "00").

The electrodes described herein (e.g., 104, 114, 118-1, 118-2, 119-1, 119-2, 204, 214, 218-1, 218-2) can be made of various conductive materials or composite structures including, but not limited to, titanium (Ti), TiN (titanium nitride), TaN (tantalum nitride), copper, iridium, platinum, ruthenium, tantalum, and/or tungsten, for example. As an example, in one or more embodiments, the bottom electrode (e.g., 114, 214) can include a seed material or can include a seed material/conductive material/capping material composite configuration.

Although embodiments are not limited to particular materials, the ferromagnetic storage materials (e.g., 106, 206-1, 206-2) can be CoFeB, NiFe, or antiferromagnetically coupled materials such as CoFeB/Ru/CoFeB, for example. The tunneling barrier material (e.g., 108, 208-1, 208-2) can be MgO, Al2O3, or other magnetic insulators, for example. The pinned ferromagnetic material (e.g., 110, 210-1, 210-2.) can be Fe, FeNi, Co, FeB, CoFeB, or various synthetic antiferromagnetic (SAF) structures such as CoFe/Ru/CoFe or CoFe/Ru/CoFeB, for example. The antiferromagnetic material (e.g., 112, 212) can be NiO, CoO, FeMn, PtMn, IrMn, or NiMn, for example. The multiferroic tunneling barrier materials (e.g., 108, 208-1, 208-2) can be BiFeO3 (BFO), TbMn2O5, TbMnO3, $Bi_4Fe_2TiO_{12}$, or $NiBi_2O_4$, for example.

Figure 3:
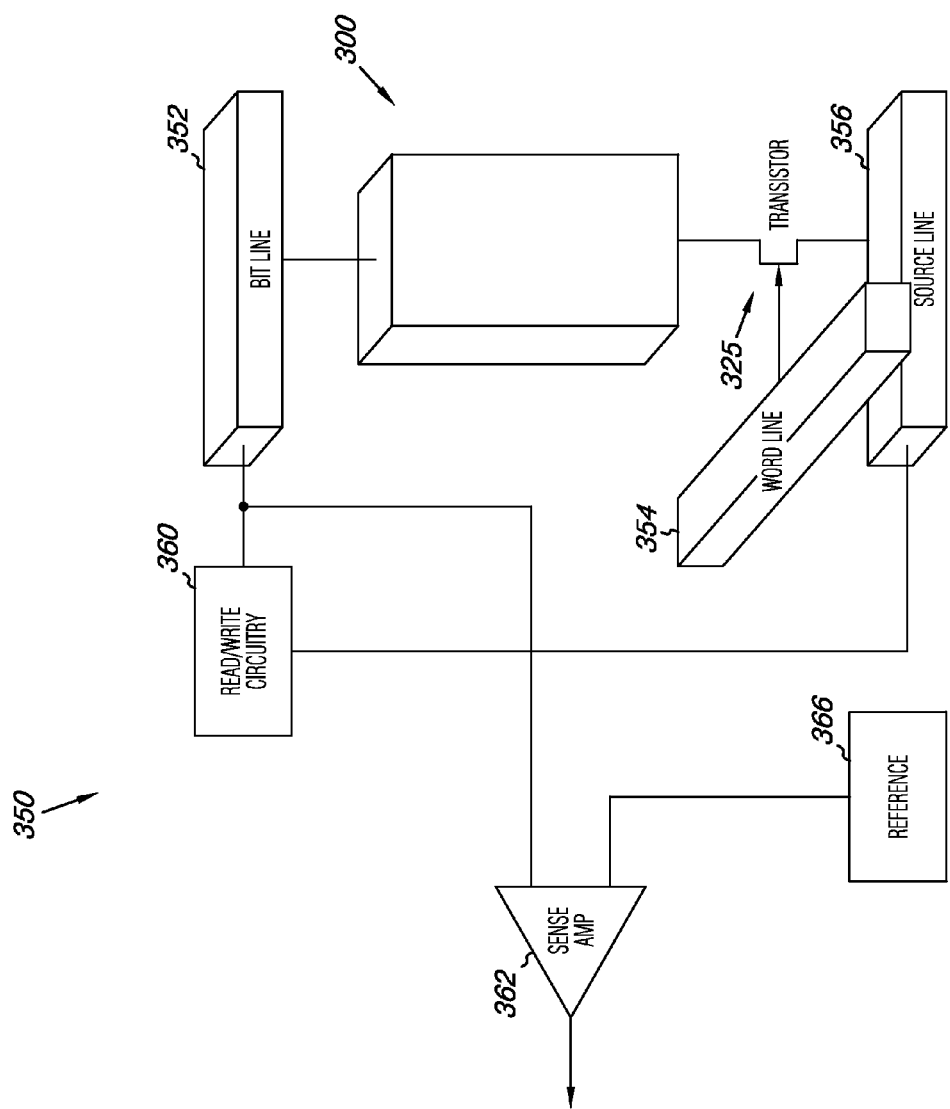
FIG. 3 illustrates a portion of a memory array having one or more SIT memory cell structures in accordance with embodiments of the present disclosure.

FIG. 3 illustrates a portion of a memory array 350 having one or more STT memory cell structures in accordance with embodiments of the present disclosure. An STT RAM cell can include an STT memory cell structure (e.g., such as structures 100-1, 100-2, 100-3, 200-1, and 200-2 described above) coupled to an access transistor 325. The access transistor 325 can be a vertical FET such as those shown in FIGS. 1A-1C and FIG. 2B.

In this example, the array 350 includes a bit line 352, a word line 354, a source line 356, read/write circuitry 360, a bit line reference 366, and a sense amplifier 362. The STT memory structure 300 can include one or more MTJ elements. As described above, the MTJ element of the STT memory structure 300 can include a tunneling barrier material that is a multiferroic material (e.g., 108, 208-1, 208-2).

In operation, the STT memory cell structure 300 can be selected to be programmed. An electric field can be provided via voltage differences applied across electrodes corresponding to structure 300 (e.g., electrodes 118-1, 118-2, 119-1, 119-2, 218-1, 218-2) in order to induce magnetic polarization changes in the multiferroic tunneling barrier material of the structure 300, which results in corresponding magnetization changes within the ferromagnetic storage material(s) of structure 300. In various instances, the applied electric field can be sufficient to switch the magnetization direction of the storage material(s) (e.g., without providing additional programming current to the cell).

In instances in which the applied electric field is not sufficient to induce full switching of the magnetization of the ferromagnetic storage material(s), a programming current can be applied to the cell, and the current can be spin polarized by the pinned ferromagnetic material(s) of the cell structure 300 such that a torque (e.g., a torque in addition to the torque provided to the magnetic moments within the ferromagnetic storage material(s) due to the exchange coupling between the storage material(s) and one or more multiferroic materials in contact therewith) is exerted on the ferromagnetic storage material(s) (e.g., ferromagnetic storage materials 106, 206-1, 206-2), which can switch the magnetization of the ferromagnetic storage material(s) to program (e.g. write to) the cell. In this manner, the application of the electric field can be used to reduce the programming current (e.g., the critical switching current) required to switch the magnetization directions within the ferromagnetic storage material(s) of the STT memory cell.

In programming operations in which a programming current is used, the read/write circuitry 360 may generate a programming current to the bit line 352 and the source line 356. Once the ferromagnetic storage material is magnetized according to the spin polarity of the programming current, the programmed state is written to the STT RAM cell.

To read the STT RAM cell, the read/write circuitry 360 generates a read current to the bit line 352 and the source line 356 through the structure 300 and the transistor 325. The programmed state of the STT RAM cell depends on the resistance across the structure 300, which may be determined by the voltage difference between the bit line 352 and the source line 356. In one or more embodiments, the voltage difference may be compared to a reference 366 and amplified by a sense amplifier 362.

One or more embodiments of the present disclosure can induce magnetization switching within an STT RAM cell via applied electric fields, which can provide various benefits. For instance, embodiments can reduce the current density required to induce magnetization switching in STT RAM cells. Embodiments can also assist with preventing thermally induced magnetic switching, which can provide added reliability and/or stability associated with STT RAM cells, among other benefits. Embodiments can include multi-bit STT memory cell structures having reduced current density requirements for programming and can have a reduced physical footprint as compared to previous STT memory cells, among other benefits.

Spin Torque Transfer (STT) memory cell structures and methods are described herein. One or more STT memory cell structures include a tunneling barrier material positioned between a ferromagnetic storage material and a pinned ferromagnetic material in contact with an antiferromagnetic material. The tunneling barrier material is a multiferroic material and the antiferromagnetic material, the ferromagnetic storage material, and the pinned ferromagnetic material are positioned between a first electrode and a second electrode.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of Equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory cell structure, comprising:
   a ferromagnetic storage material, a pinned ferromagnetic material, and an antiferromagnetic material positioned between a first electrode and a second electrode;
   a multiferroic material positioned between the ferromagnetic storage material and the pinned ferromagnetic material; and
   a third electrode configured to provide an electric field to the multiferroic material responsive to a voltage applied between the third electrode and at least one of:
   the first electrode; and
   the second electrode.

2. The memory cell structure of claim 1, wherein the multiferroic material serves as a tunneling barrier material.

3. The memory cell structure of claim 1, further comprising a dielectric material positioned between the multiferroic material and at least one of the third electrode and a fourth electrode.

4. The memory cell structure of claim 1, wherein the third electrode is a gate of an access device.

5. The memory cell structure of claim 1, wherein the third electrode is a gate of a transistor.

6. The memory cell structure of claim 5, wherein the transistor is a vertical transistor.

7. The memory cell structure of claim 1, wherein the multiferroic material is bismuth ferrite (BiFeO3).

8. The memory cell structure of claim 1, wherein the multiferroic material has a thickness of about 1 nanometer (nm) or less.

9. A memory cell, comprising:
   a stack structure including:
      a first magnetic tunneling junction (MTJ) element positioned between a first electrode and a second electrode, wherein a tunneling barrier material of the first MTJ comprises a first multiferroic material;

a second MTJ element positioned between the first electrode and the second electrode, wherein a tunneling barrier material of the second MTJ comprises a second multiferroic material;

wherein at least one of the first and the second multiferroic materials are located between a third electrode and a fourth electrode; and wherein a dielectric material is located between the at least one of the first and the second multiferroic material and at least one of the third and the fourth electrode.

10. The memory cell of claim 9, wherein the access device is a transistor.

11. The memory cell of claim 10, wherein the transistor is a vertical transistor.

12. The memory cell of claim 9, wherein the third electrode and the fourth electrode are configured to provide an electric field to the tunneling barrier material of at least one of the first and the second MTJ in association with a programming operation performed on the memory cell.

13. The memory cell of claim 9, wherein:
the first multiferroic material is positioned between a first ferromagnetic storage material and a first pinned ferromagnetic material associated with the first MTJ element; and
the second multiferroic material is positioned between a second ferromagnetic storage material and a second pinned ferromagnetic material associated with the second MTJ element.

14. The memory cell of claim 9, wherein the first multiferroic material and the second multiferroic material have different ferroelectric polarizabilities.

15. A memory cell, comprising:
a magnetic tunneling junction (MTJ) element located between a first electrode and a second electrode, wherein a tunneling barrier material of the MTJ is a multiferroic material; and
wherein the multiferroic material is located between a third electrode and a fourth electrode; and
wherein a dielectric material is located between the multiferroic material and at least one of the third electrode and the fourth electrode.

16. The memory cell of claim 15, wherein at least one of the third electrode and the fourth electrode is configured to provide an electric field to the multiferroic material in association with a programming operation performed on the memory cell.

17. The memory cell of claim 15, wherein the multiferroic material includes:
a first edge portion aligned with a first edge portion of a ferromagnetic storage material of the MTJ element; and
a second edge portion aligned with a second edge portion of the ferromagnetic storage material of the MTJ element.

18. The memory cell of claim 15, further comprising an access device coupled to the MTJ element, wherein the access device is a vertical access device.

19. The memory cell of claim 15, further comprising an access device coupled to the MTJ element, wherein the access device is a transistor.

20. The memory cell of claim 19, wherein the transistor is a vertical field effect transistor (vFET).

21. A method of operating a memory cell, the method comprising:
altering a magnetization direction of a free ferromagnetic storage material of a magnetic tunneling junction (MTJ) element of the memory cell by providing an electric field to a multiferroic tunneling barrier material of the MTJ element;
wherein providing the electric field to the multiferroic tunneling barrier material includes applying a voltage difference between a first gate electrode and a second gate electrode of an access device corresponding to the memory cell; and
wherein a dielectric material is located between the multiferroic tunneling barrier material and at least one of the first gate electrode and the second gate electrode.

22. The method of claim 21, including altering a magnetization direction of a second free ferromagnetic storage material of a second MTJ element of the memory cell by providing the electric field to a multiferroic tunneling barrier material of the second MTJ element.

* * * * *